United States Patent [19]

Tsubouchi et al.

[11] 4,154,192
[45] May 15, 1979

[54] MANUFACTURING APPARATUS FOR SEMICONDUCTOR DEVICES

[75] Inventors: Natsuro Tsubouchi; Akira Nishimoto; Kirokazu Moyoshi, all of Itami, Japan

[73] Assignee: Mitsubishi Denki Kabushiki Kaisha, Tokyo, Japan

[21] Appl. No.: 859,108

[22] Filed: Dec. 9, 1977

[30] Foreign Application Priority Data

Dec. 10, 1976 [JP] Japan .................. 51-148845
Dec. 10, 1976 [JP] Japan .................. 51-147765

[51] Int. Cl.$^2$ ............................................. C23C 13/00
[52] U.S. Cl. .................. 118/49.1; 427/248 A
[58] Field of Search ........... 118/48, 49, 49.1, 49.5; 427/248 R, 248 A, 248 B, 248 C, 248 E, 255, 294, 295, 86, 94, 124

[56] References Cited

U.S. PATENT DOCUMENTS

| | | | |
|---|---|---|---|
| 3,098,763 | 7/1963 | Deal et al. | 118/49.5 |
| 3,645,695 | 2/1972 | Koepp et al. | 118/48 |
| 3,742,904 | 7/1973 | Bishop | 118/48 |
| 3,837,905 | 9/1974 | Hile et al. | 427/248 A |
| 4,018,184 | 4/1977 | Nagasawa et al. | 118/49.1 |

*Primary Examiner*—Mervin Stein
*Attorney, Agent, or Firm*—Wenderoth, Lind & Ponack

[57] ABSTRACT

An oxidizing tube encircled by an electric heater is disposed within a pressure envelope. A high pressure inert gas is supplied to the envelope and tube while hydrogen and oxygen are supplied to the tube while being kept at an elevated temperature to react with each other to form steam. The steam oxidizes the surfaces of silicon wafers placed in the tube to form silicon dioxide films on them. Alternatively a water evaporator may be disposed within the pressure envelope to directly supply steam to the tube with the high pressure gas aiding the supply of the steam.

2 Claims, 3 Drawing Figures

MANUFACTURING APPARATUS FOR SEMICONDUCTOR DEVICES

BACKGROUND OF THE INVENTION

The invention relates to a device for forming an oxide film on a semiconductor under high pressures.

Oxide film forming devices of the type referred to have been commonly employed to manufacture a variety of planar type integrated circuits including a semiconductor substrate composed of silicon. In this case, it has been required to form an oxide film consisting of silicon dioxide and having a thickness of from about 1 to 2 microns while remaining substantially uncontaminated. In order to form such a thick film of silicon dioxide, it has been necessary to heat the silicon substrate in an oxidizing atmosphere at about 1,000° C. for about ten hours. Such an oxidizing atmosphere can comprise, for example, saturated steam at 100° C. under one atm. The heating for such a long time has been undesirable because it increases the lattice defects in the silicon substrate and/or it brings about the re-diffusion of a diffusion layer formed on the silicon substrate.

In order to avoid these disadvantages, there have already been proposed devices comprising a pressure envelope for accommodating silicon substrates therein, heating means disposed in the envelope to heat the silicon substrates to about 1,000° C. and boosting means for raising the particular oxidizing atmosphere to about 10 atm. By maintaining the oxidizing atmosphere at that elevated temperature under such a high pressure, the silicon dioxide film has been formed on silicon substrates at a greatly accelerated growth.

In the conventional devices as above described, the heating means has included a heat generating element disposed in the same envelope as the silicon substrates. Therefore it has been possible for that portion of the oxidizing atmosphere contacted by the heat generating element to contact the silicon substrates.

Also because the pressurized steam involved is generated by an associated boiler, contaminating materials originating from the boiler have been mixed with the steam. Therefore the silicon substrates and silicon dioxide films formed thereon become contaminated. As a result, the proposed devices have not been always satisfactory.

Accordingly it is an object of the present invention to provide a new and improved oxide film-forming device for effecting the oxidization with steam under a high pressure.

It is another object of the present invention to provide a new and improved device for forming a clean, thick oxide film in short time interval.

It is still another object of the present invention to provide an oxide film-forming device of the type as above described in the preceding paragraph which is relatively simply constructed with cheap materials.

SUMMARY OF THE INVENTION

The present invention provides an apparatus for manufacturing semiconductor devices, comprising, in combination, an oxidizing tubular member for hermetically accommodating, therein semiconductor substrates to be processed, heating means disposed around the outer periphery of the tubular member to heat the tubular member and semiconductor substrates, a pressure envelope for hermetically housing therein both the tubular member and the heating member, means for introducing an inert gas into the tubular member and pressure envelope, means for controlling the pressure of the inert gas before it is introduced into the tubular member and the pressure envelope, and means for forming an atmosphere of steam within the tubular member.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENTS

Figure 1:
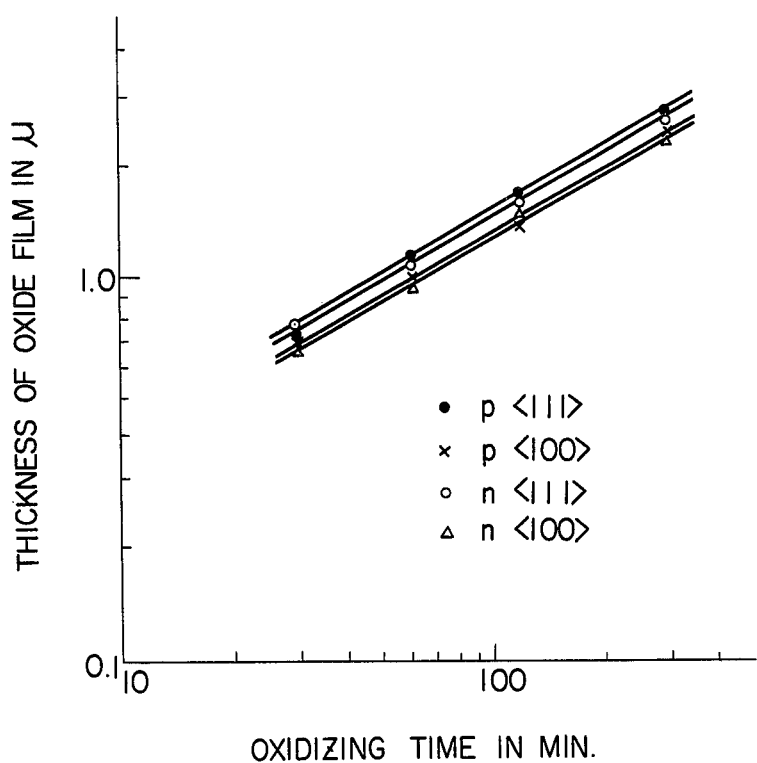
FIG. 1 is a graph plotting a thickness of the silicon dioxide film on the ordinate against the oxidizing time on the abscissa, the data having been obtained by experiments using a preferred embodiment of the present invention.

Referring now to FIG. 1 of the drawings, there are illustrated the results of experiments conducted with different silicon substrates by employing a preferred embodiment of the present invention as will be described hereinafter. In the experiments, silicon substrates were oxidized in an atmosphere of steam at 1,000° C. at a pressure of 6.5 atm. In FIG. 1 the valves on the ordinate represent the thickness of a silicon dioxide film in microns and those on the abscissa represent the oxidizing time in minutes, both scales being graduated in logarithmic units. The "black circle" denotes a measured thickness of a silicon dioxide film formed on a crystallographic plane <111> of a P type silicon substrate and the "white circle" denotes a measured thickness of a silicon dioxide film formed on a crystallographic plane <111> of an N type silicon substrate. Similar films formed on the crystallographic plane <111> of a P and an N type silicon substrate are designated by the "cross" and "delta" respectively.

From FIG. 1 it is seen that the thickness of the silicon dioxide films formed on the silicon substrates increases with the oxidizing time in a similar manner and independently of the conductivity type and crystallographic axis of the substrate.

Figure 2:
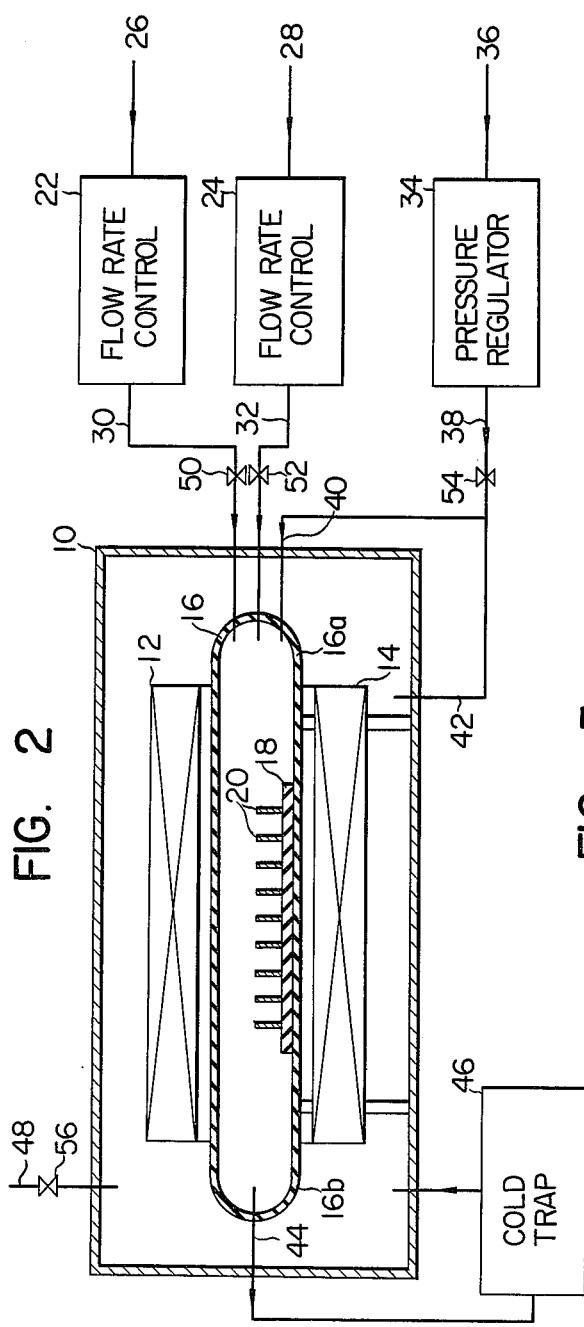
FIG. 2 is a schematic sectional view of an oxide film-forming device constructed in accordance with the principles of the present invention.

Referring now to FIG. 2, there is illustrated an oxide film-forming device constructed in accordance with the principles of the present invention. The arrangement illustrated comprises a pressure envelope 10 formed, for example, of a stainless steel plate 6 mm thick and including a detachable cover for hermetically closing an opening thereof through which semiconductor samples such as silicon wafers are introduced into and removed from an oxidizing tubular member disposed therein as will be subsequently described although the cover and opening are not shown only to keeping the illustration single. The pressure envelope 10 is shown in FIG. 1 as being of a unitary structure because it is in operation and maintains a high pressure therein. Then heating means designated by the reference numerals 12 and 14 is disposed in place within the pressure envelope 10 and is formed, for example, of an electrically energized kanthal heater, a temperature sensing thermocouple etc. and has a central longitudinal opening.

It is to be understood that the pressure envelope 10 is operatively associated with controllers, a source of electric power etc. normally employed with well-known diffusion furnaces and disposed externally of the envelope although they are not shown only for simplicity of illustration.

An oxidizing tubular member 16 is shown in FIG. 1 as fixedly extending through the central longitudinal opening in the heating means 12-14 and having disposed therein a boat 18 on which a plurality of semiconductor samples 20 such as silicon wafers are disposed at substantially equal intervals with the main opposite faces thereof substantially perpendicular to the general plane of the boat 18. The tubular member 16 is formed, for example, of quartz and includes an opening through which the boat 18 with the silicon wafers 20 is introduced into and removed from the tubular member 16. The opening is hermetically closed with a cover so as to fit that opening. However, the opening and cover therefor are not shown and the tubular member 16 is shown as having a unitary structure only for simplicity of illustration.

A pair of flow rate controls 22 and 24 such as mass flow controllers well known in the art receive different gases, in this case, oxygen and hydrogen, from gas sources 26 and 28 respectively and are connected to individual feed pipes 30 and 32 which, in turn, open into the tubular member 16 on the incoming end 16a. Thus each of the flow rate control 22 or 24 controls the flow of the associated gas from its source 26 or 28 at a predetermined flow rate and supplies the gas thus controlled to the tubular member 16 through the feed pipe 30 or 32.

Further a pressure regulator 34 receives an inert gas such as nitrogen, argon or the like from a source of inert gas 36 and is connected to a feed pipe 38 subsequently divided into branch pipes 40 and 42. The branch pipe 40 opens into the tubular member 16 on the incoming end 16a while the branch pipe 42 opens into the pressure envelope 19. Thus the pressure regulator 34 controls the flow of the inert gas from the source 36 at a predetermined pressure after which the controlled gas is supplied to the tubular member 16 through the pipes 38 and 40 and also to the pressure envelope 10 through the pipes 38 and 42.

A connecting pipe 44 connects the outgoing end 16b of the tubular member 16 to a cold trap 46 that is connected to the pressure envelope 10 through a pipe. Thus it is seen that the tubular member 16 is in fluid flow communication with the pressure envelope 10 through the cold trap 46 connected therebetween.

The pressure envelope 10 is connected to the atmosphere through an exhaust pipe 48.

As shown in FIG. 2, the pipes 30,32,38 and 48 are provided with opening and closing valves 50,52,54 and 56 respectively.

The operation of the arrangement will now be described. First the heating means 12-14 is heated to a predetermined temperature, in this case, 1,000° C. Then covers (not shown) for the pressure envelope and tubular member 10 and 16 respectively are removed therefrom respectively and a plurality of samples 20 such as silicon wafers fixedly erected on the boat 18 are introduced into the central portion of the tubular member 16 maintained at the predetermined temperature. Under these circumstances, the valve 54 is in its open position and inert gas as above described is adjusted to a pressure somewhat higher than the ambient pressure by the pressure regulator 34 and flows through the tubular member 16 and the envelope 10. Thus the tubular member 16 and the envelope 10 are fully filled with the inert gas.

Then the tubular member and pressure envelope 16 and 10 respectively are hermetically closed by the respective covers (not shown) while the pressure regulator 34 is controlled to increase the pressure of the inert gas flowing therethrough to a predetermined high magnitude. As a result, the inert gas at an increased pressure continues to flow through the tubular member 16 and the pressure envelope 10 until the two reach the predetermined high pressure and are maintained at that pressure.

Following this, the valves 50 and 52 are put in their open position to permit oxygen from the source 26 and hydrogen from the source 28 to flow into the tubular member 16 after both gases are been controlled to predetermined flow rates, for example, 2 and 3.8 l/min. by the flow rate controls 22 and 24 respectively. Since the interior of the tubular member 16 is maintained at an elevated temperature as determined by the heating means 12-14, the oxygen and hydrogen flowing thereinto react with each other to form steam as the product of the combustion. Thus the interior of the tubular member 16 is filled with an oxidizing atmosphere of steam. This oxidizing atmosphere of steam oxidizes surfaces of the individual samples 20, for example, the silicon wafers, to form oxide films or silicon dioxide films (not shown) thereon.

Thereafter the steam from the tubular member 16 is delivered to the cold trap 46 through the connecting pipe 44 and then returns to the pressure envelope 10. Alternatively the steam may be exhausted to the atmosphere through the pipe 44 although this is not shown.

The data shown in FIG. 1 has been obtained by using the arrangement as above described in conjunction with FIG. 2.

Figure 3:
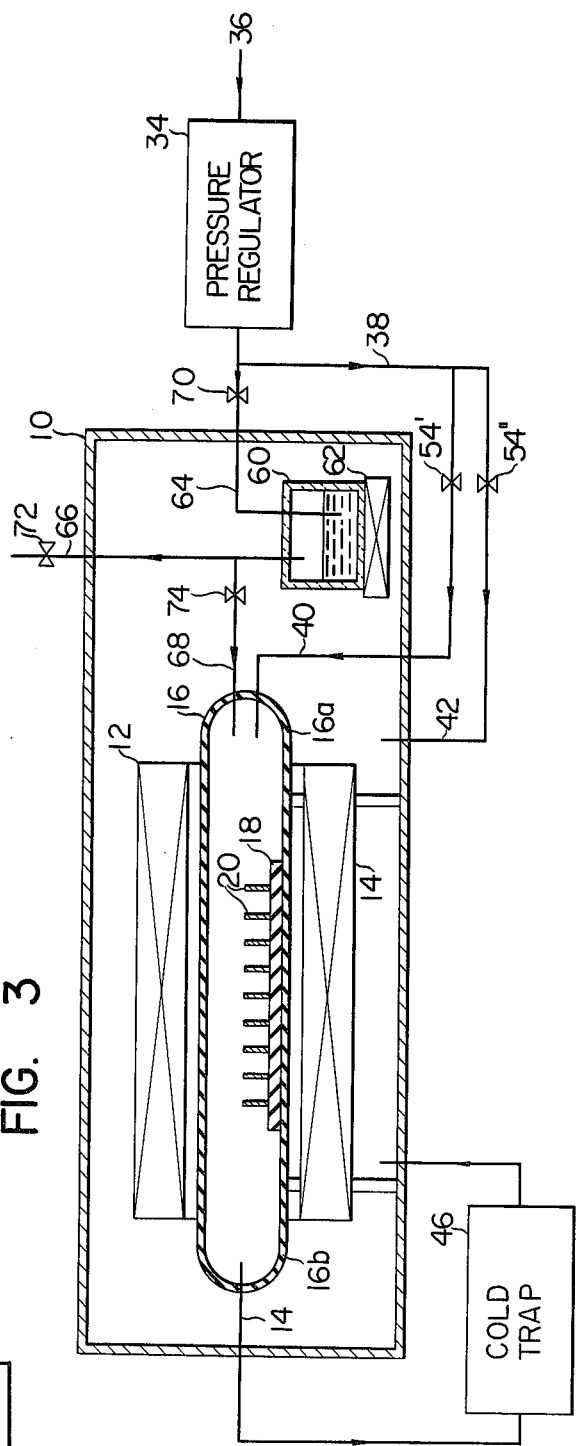
FIG. 3 is a view similar to FIG. 2 but illustrating a modification of the present invention.

A modification of the present invention is illustrated in FIG. 3 wherein like reference numerals designate components identical or corresponding to those shown in FIG. 2. The arrangement illustrated is different from that shown in FIG. 2 only in that in FIG. 3 the steam is formed by the vaporization of water rather than through the combustion of hydrogen within oxygen.

In the arrangement illustrated in FIG. 3, an enclosed evaporator 60 is disposed in one end portion, in this example the righthand portion as viewed in FIG. 3 of the pressure envelope 10 and has a heater 62 thereunder. The evaporator 60 is be preferably formed of glass commercially available under trade mark "Pyrex" and is charged with a suitable amount of water.

As in the arrangement of FIG. 2, the pressure regulator 34 receives an inert gas such as nitrogen from the source of inert gas 36 serving also as a carrier gas for steam and is connected to the feed pipe 38 which are subsequently divided into branch pipes 40 and 42 opening into the tubular member 16 and the pressure envelope 10 respectively. The pressure regulator 34 is also connected to a carrier pipe 64 hermetically extending through the top wall of the evaporator 60 and opening in the water in the latter.

An exhaust pipe 66 extends from within the space above the water level within the evaporator 60 hermetically through the top wall of the evaporator and also through the top wall of the pressure envelope 10 until the outer end is exposed to the atmosphere. The exhaust pipe 66 has a steam pipe 68 extending laterally therefrom and terminating in the tubular member 16 on the incoming end 16a.

The pipes 40, 42, 64, 66 and 68 are provided with opening and closing valves 54', 54'', 70, 72 and 74 respectively.

In other respects the arrangement is substantially similar to that shown in FIG. 3.

In operation, the heating means 12–14 are preset to a predetermined temperature, for example, 1,000° C. as in the arrangement of FIG. 2 and the heater 62 is preset to a predetermined temperature on the order of 180° C. sufficient to generate steam up to about 10 atm. within the evaporator 60. At the beginning of the operation, the valve 72 is in its open position while the valve 74 is in its closed position whereby steam from the boiling water is exhausted externally of the pressure envelope 10 through the exhaust pipe 66.

Subsequently the covers (not shown) are removed from the pressure envelope and tubular member 10 and 16 respectively and the samples 20 erected on the boat 18 are introduced into the central portion of the tubular member 16 maintained at the predetermined temperature with the valves 54' and 54'' being in their open position. The opening of the valves 54' and 54'' permits the inert gas from the source 36 to flow through the pressure regulator 34 while being controlled to a pressure somewhat higher than the ambient pressure and then to flow into the tubular member 16 through the pipes 38 and 40 while flowing into the pressure envelope 10 through the pipes 38 and 42. Therefore the tubular member 16 is filled with the inert gas thereby to prevent the oxidation of the samples 28 from proceeding. Also the envelope 10 is filled with the inert gas.

Then the tubular member and pressure envelope 16 and 10 respectively are hermetically closed by the respective covers (not shown) and the pressure regulator 34 is controlled to deliver the inert gas at a predetermined pressure, for example 5 atm., after which the valve 74 is opened and the valve 72 is closed. The opening of the valve 74 permits the steam from the evaporator 60 to flow into the tubular member 16 through the pipe 68. Since the valves 54' and 54'' are in their open position, the pressure regulator 34 supplies the inert gas at 5 atm. to both the tubular member 16 and the pressure enclosure 10 through the pipe 38 and the branch pipes 40 and 42 and maintains them at 5 atm.

Subsequently the valve 70 is opened to permit the pressure regulator 34 to supply a controlled amount of the inert gas to the evaporator 60 through the carrier pipe 64. In the example illustrated, the inert gas has been supplied at a flow rate of 2 l/min. to the evaporator 60. In the evaporator 60 the inert gas bubbles in the boiling water therein and serves as a carrier gas to carry the steam into the tubular member 16. The high pressure steam thus entering the tubular member 16 oxidizes the samples 20 and leaves the tubular member through the pipe 44.

In summary, the present invention provides an oxide film-forming device comprising a pressure envelope and an oxidizing tubular member disposed in the envelope and completely isolated from any contamination source such as external heating means for heating the tubular member or the like. By introducing a high pressure steam into the tubular member to oxidize semiconductor wafers disposed therein, clear thick oxide films can be formed on the wafers in a short time. The high pressure steam may be formed by directly introducing hydrogen and oxygen and reacting them with each other. Alternatively steam from an evaporator disposed in the pressure envelope may be directly introduced into the tubular member with a high pressure inert gas serving as a carrier gas for the steam. In the latter case there is a small difference between the pressure in the tubular member and the evaporator and that on the exterior thereof. Therefore, the tubular member and evaporator can be formed of a material having a low pressure resistance and which can be kept clean, for example, quartz Pyrex (trade mark) or the like.

While the present invention has been illustrated and described in conjunction with a few preferred embodiments thereof for forming the silicon dioxide film on silicon wafers it is to be understood that numerous changes and modifications may be resorted to without departing from the spirit and scope of the present invention. For example, the present invention is equally applicable to the formation of an oxide film on semiconductor wafers other than silicon.

What we claim is:

1. An apparatus for manufacturing semiconductor devices, comprising, in combination, an oxidizing tubular member for hermetically accommodating therein semiconductor substrates to be processed, heating means disposed around the outer periphery of said tubular member for heating both said tubular member and semiconductor substrates therein, a pressure envelope hermetically housing therein both said tubular member and said heating means, inert gas feed means connected to said tubular member and said pressure envelope for introducing an inert gas into said tubular member and said pressure envelope, control means connected to said feed means for controlling the pressure of the inert gas before it is introduced into said tubular member and said pressure envelope, and means for forming an atmosphere of steam within said tubular member having means for introducing hydrogen into said tubular member, means for selectively introducing oxygen into said tubular member, means for controlling the rate of flow of hydrogen being introduced into said tubular member, and means for controlling the rate of flow of oxygen being introduced into said tubular member.

2. An apparatus for manufacturing semiconductor devices, comprising, in combination, an oxidizing tubular member for hermetically accommodating therein semiconductor substrates to be processed, heating means disposed around the outer periphery of said tubular member for heating both said tubular member and semiconductor substrates therein, a pressure envelope hermetically housing therein both said tubular member and said heating means, inert gas feed means connected to said tubular member and said pressure envelope for introducing an inert gas into said tubular member and said pressure envelope, control means connected to said feed means for controlling the pressure of the inert gas before it is introduced into said tubular member and said pressure envelope, and means for forming an atmosphere of steam within said tubular member having a water evaporator disposed in said pressure envelope, heater means disposed in said pressure envelope for heating said evaporator for generating steam, and means connected between said water evaporator and said tubular member for introducing said steam generated by said evaporator into said tubular member.

* * * * *